United States Patent
Fan

(10) Patent No.: US 7,972,904 B2
(45) Date of Patent: Jul. 5, 2011

(54) WAFER LEVEL PACKAGING METHOD

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 175 days.

(21) Appl. No.: 12/423,456

(22) Filed: Apr. 14, 2009

(65) Prior Publication Data
US 2010/0261315 A1  Oct. 14, 2010

(51) Int. Cl.
*H01L 21/00* (2006.01)

(52) U.S. Cl. ........ 438/113; 438/114; 438/118; 438/401; 438/462; 438/465; 438/464; 257/E21.503; 257/E21.599; 257/E23.179; 257/E21.499

(58) Field of Classification Search ............ 438/68, 438/114, 118, 464, 465, 462, 401; 257/E21.503, 257/E23.18, E21.504, E21.502, E21.237, 257/E21.599, E23.179, E21.511, E21.506, 257/797, E21.499

See application file for complete search history.

(56) References Cited

U.S. PATENT DOCUMENTS

| | | | | |
|---|---|---|---|---|
| 5,925,936 A * | 7/1999 | Yamaji | ............ | 257/787 |
| 6,399,178 B1 * | 6/2002 | Chung | ............ | 428/131 |
| 6,455,353 B2 | 9/2002 | Lin | | |
| 6,500,764 B1 * | 12/2002 | Pritchett | ............ | 438/690 |
| 6,818,550 B2 * | 11/2004 | Shibata | ............ | 438/633 |
| 7,776,649 B1 * | 8/2010 | Fan | ............ | 438/106 |
| 2001/0055834 A1 * | 12/2001 | Lin | ............ | 438/106 |
| 2005/0048693 A1 * | 3/2005 | Yoon | ............ | 438/106 |
| 2008/0265445 A1 * | 10/2008 | Feger et al. | ............ | 257/797 |
| 2009/0079052 A1 * | 3/2009 | Youn | ............ | 257/678 |
| 2009/0200675 A1 * | 8/2009 | Goebel et al. | ............ | 257/758 |

* cited by examiner

*Primary Examiner* — Laura M Menz
*Assistant Examiner* — Latanya Crawford
(74) *Attorney, Agent, or Firm* — Muncy, Geissler, Olds & Lowe, PLLC

(57) ABSTRACT

A wafer level packaging method is revealed. Firstly, a wafer with a plurality of bumps disposed on a surface is provided. Placing a dielectric tape on a mold plate is followed. Then, the wafer is laminated with the mold plate to make the dielectric tape be compliantly bonded to the surface of the wafer and to make the bumps be embedded in the dielectric tape. After removing the mold plate, flattening the dielectric tape to form a plurality of exposed surfaces of the bumps wherein the exposed surfaces and the flattened surface of the dielectric tape are coplanar. Therefore, the exposed surfaces of the bumps can be regarded as effective alignment points for easy pattern recognition of the wafer level packaged wafers during singulation process.

16 Claims, 7 Drawing Sheets

WAFER LEVEL PACKAGING METHOD

FIELD OF THE INVENTION

The present invention relates to a method of manufacturing semiconductor devices, and more particularly to a method of manufacturing wafer level packages.

BACKGROUND OF THE INVENTION

After ICs are fabricated on a wafer, a wafer sawing process is followed to saw a clean wafer into a plurality of square dies so-called singulation. During the wafer sawing process, a dicing blade saws along the scribe lines on a clean wafer. However, in advanced wafer level packaging process, a dielectric layer is coated on a wafer to pre-packaging IC chips, to avoid moisture penetration and particles attachment, to serve as an adhesive for chip bonding, to create electrical isolation, or to serve as an encapsulating material for protecting bumps. Since the scribe lines are covered by the dielectric layer, therefore, accurate alignment for wafer sawing process becomes difficult.

In U.S. Pat. No. 6,455,353 B2, Lin discloses a dam disposed at the peripheries of a wafer so that encapsulant is completely filled in the enclosed area by the dam. Then, by removing the dam or by designing a dam smaller than a wafer, parts of the scribe lines at the peripheries of a wafer are exposed as the alignment points for wafer sawing process. However, the exposed portions of the scribe lines located at the peripheries of a wafer are incomplete and fickle due to encapsulation process, therefore, it is not easy to decide which points are the alignment points leading to misalignment. Moreover, the exposed patterns of the scribe lines are greatly affected by the dimension variation of a dam where the pattern recognition by the image processing system of the sawing equipment become difficult leading to sawing through chips instead of along the scribe lines. Furthermore, since the dam occupy certain footprint of the wafer where the wafer area covered by the dam will become bad dies or unpackaged bare dies leading to decrease of effective die area of a wafer with complicated process issues. Moreover, encapsulant is disposed on a wafer in a liquid form with poor coplanarity on the surface where more lapping time for planarization is required in the following processing steps leading to higher risks of the contaminations.

SUMMARY OF THE INVENTION

The main purpose of the present invention is to provide a wafer level packaging method for easy recognition of the alignment points during wafer sawing process.

The second purpose of the present invention is to provide a wafer level packaging method to enhance the adhesion at the interfaces between the wafer and the dielectric tape to improve the exposure of the alignment points.

The third purpose of the present invention is to provide a wafer level packaging method to reduce the lapping time for planarization.

According to the present invention, a wafer level packaging method is revealed, primarily comprising: firstly, providing a wafer with a plurality of bumps disposed on a surface, then, placing a dielectric tape on a mold plate, then, laminating the wafer with the mold plate to make the dielectric tape be bonded to the surface of the wafer and to make the bumps be embedded in the dielectric tape. After the laminating step, removing the mold plate. Finally, flattening the dielectric tape to form a plurality of exposed surfaces of the bumps wherein the exposed surfaces of the bumps and the flattened surface of the dielectric tape are coplanar.

The wafer level packaging method according to the present invention has the following advantages and functions:

1. The exposed surfaces of the bumps from the laminated dielectric tape can be regarded as the effective alignment points of a covered wafer for easy pattern recognition during wafer sawing process where the exposed surfaces of the bumps are formed by embedding the bumps in the dielectric tape during lamination process first, then by flattening the dielectric tape to form the exposed surfaces of the bumps during planarization process wherein the exposed surfaces of the bumps and the flattened surface of the dielectric tape are coplanar.
2. The exposures of the alignment points are greatly enhanced by increasing the adhesion at the interfaces between the wafer and the dielectric tape during the processing step of providing and laminating a dielectric tape.
3. The lapping time of the planarization process can be greatly reduced during the processing step of providing and laminating a dielectric tape.
4. The bumps will not be damaged by the mold plate due to the design of the holes corresponding to the bumps on a mold plate to accommodate the extruded tips during lamination process to further protect wafers from damages. Moreover, the adhesion at the interfaces between the wafer and the dielectric tapes can be enhanced without limiting by the bump heights.
5. The holes act as exhaust channels during lamination process since the holes penetrate through the mold plate.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
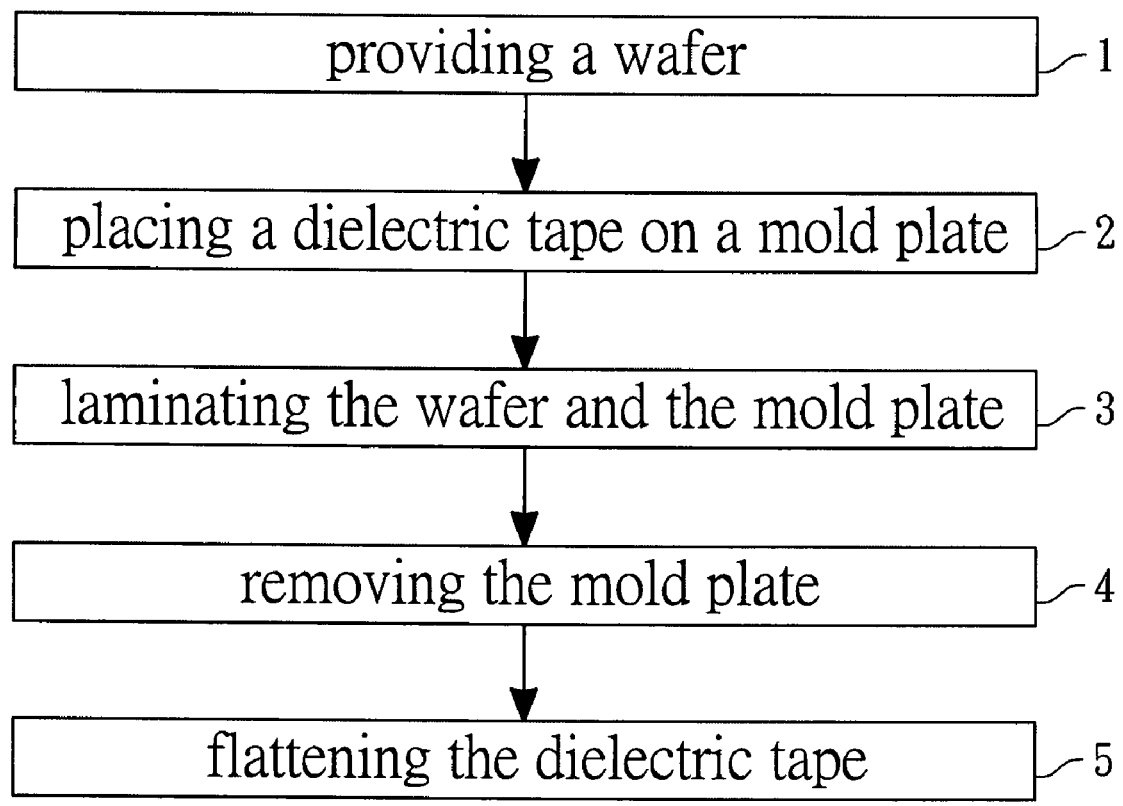
FIG. 1 is a block diagram of the process flow for a wafer level packaging method according to the present invention.
Figure 2A:
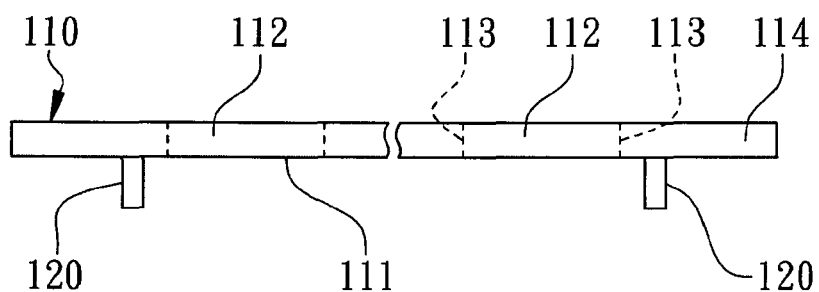
FIGS. 2A to 2E are cross-sectional views of a wafer during the wafer level packaging method according to the first embodiment of the present invention.
Figure 2B:
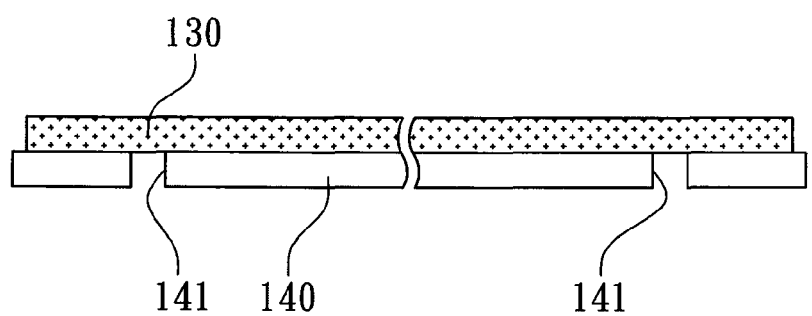
Figure 2C:
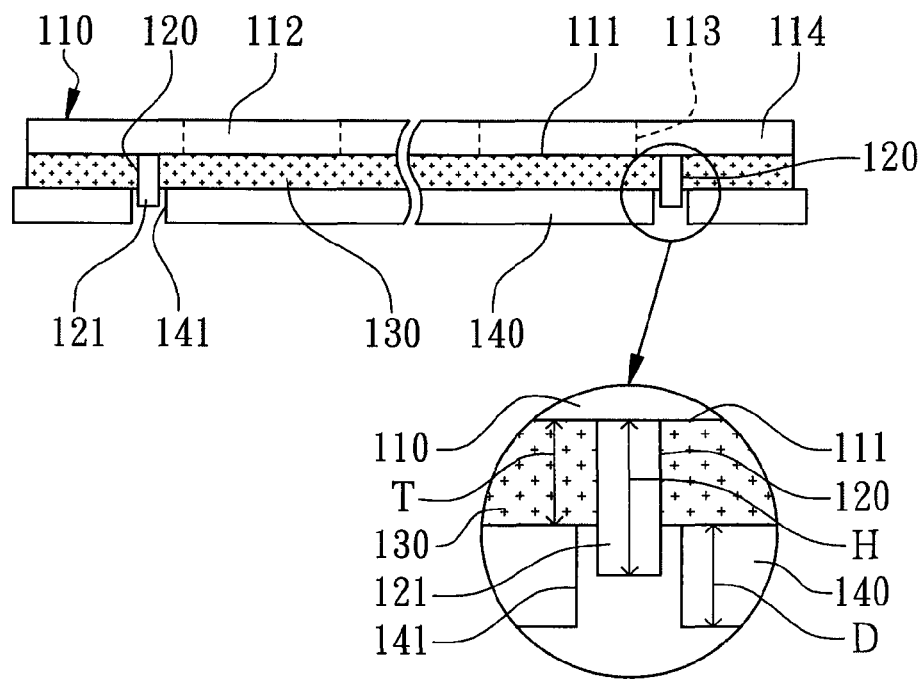
Figure 2D:
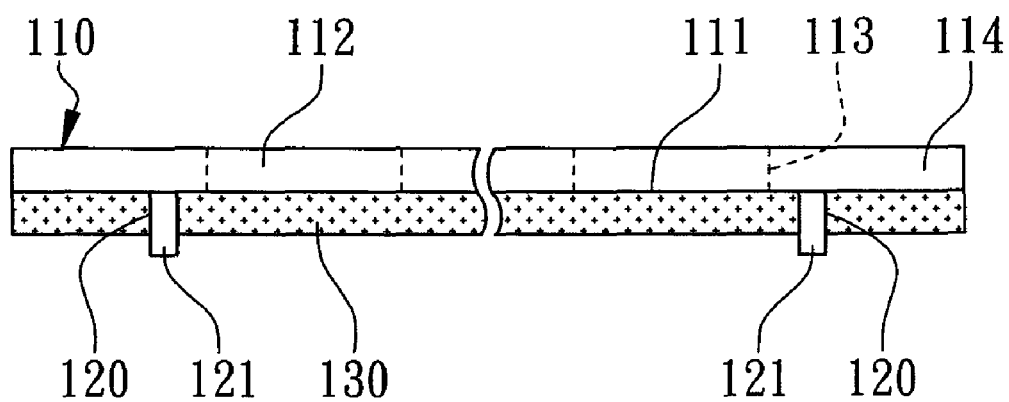
Figure 2E:
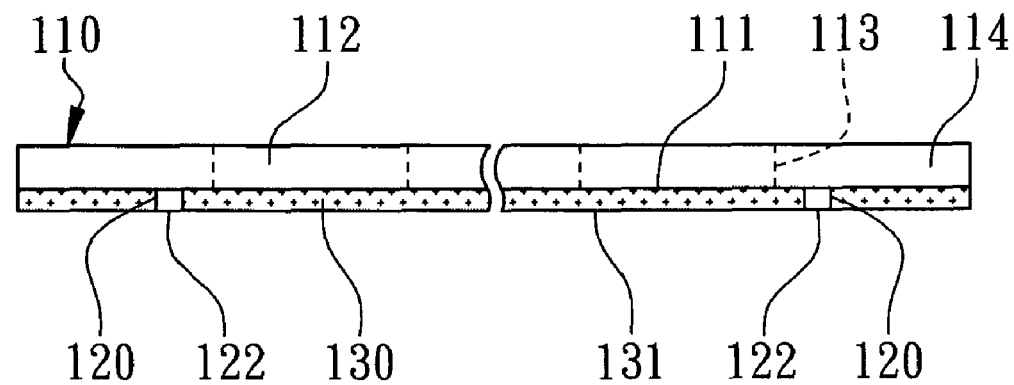
Figure 3:
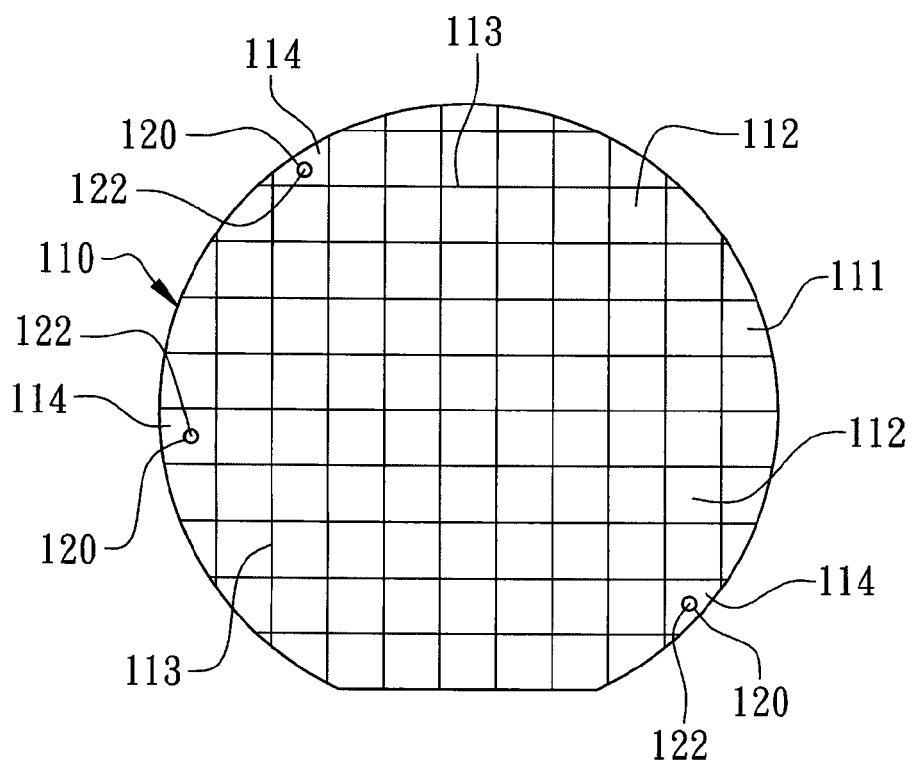
FIG. 3 is a top view of a wafer according to the first embodiment of the present invention.
Figure 4:
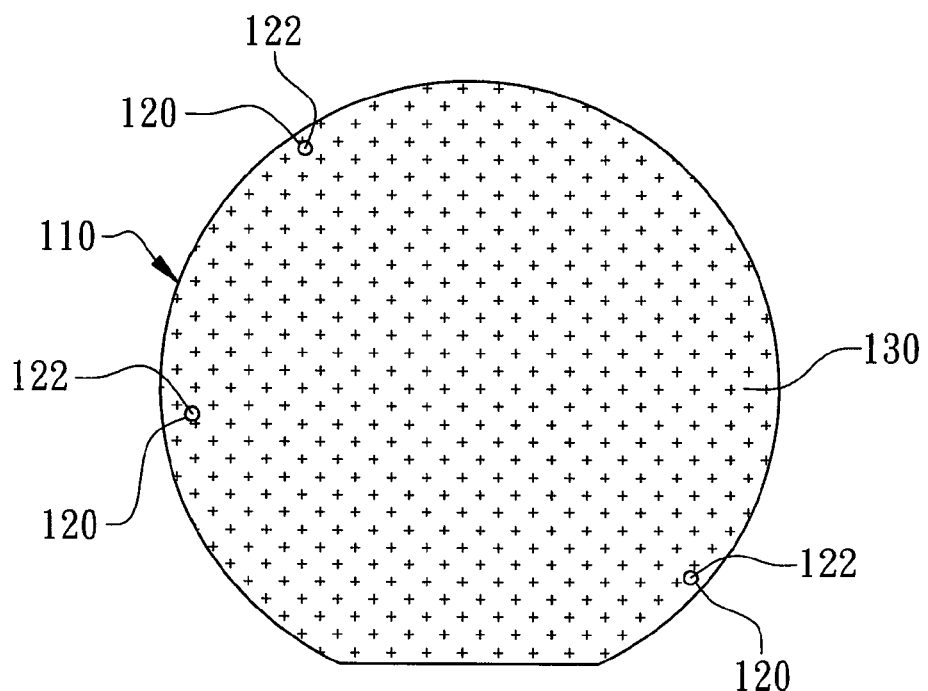
FIG. 4 is a top view of the covered wafer after removing the mold plate during the wafer level packaging method according to the first embodiment of the present invention.

According to the first embodiment of the present invention, a wafer level packaging method is illustrated in FIG. 1 for block diagrams of the process flow and FIGS. 2A to 2E for cross-sectional views of a wafer during wafer level packaging process, moreover, the top views from an exposed wafer to a covered wafer during the wafer level packaging method are illustrated in FIG. 3 and FIG. 4.

As shown in FIG. 1, the wafer level packaging method according to the present invention primarily comprises the following steps of: "providing a wafer" as step 1, "placing a dielectric tape on a mold plate" as step 2, "laminating the wafer and the mold plate" as step 3, "removing the mold plate" as step 4, and "flattening the dielectric tape" as step 5 where the components in the process are illustrated by FIGS. 2A to 2E and FIG. 3 and FIG. 4 as follows.

Figure 5:
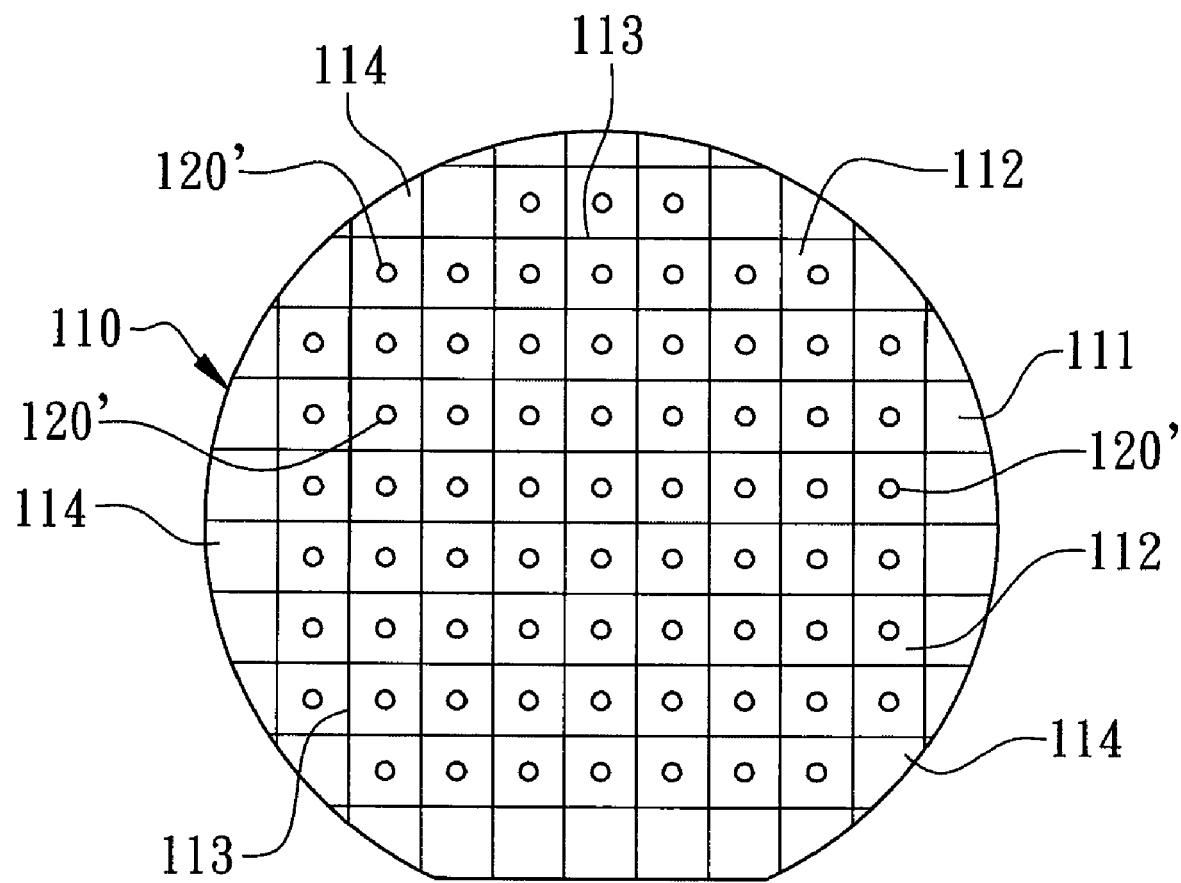
FIG. 5 is a top view of another wafer with bumps disposed on the dies according to the variation of the first embodiment of the present invention.

Firstly, step 1 is performed. As shown in FIG. 2A and FIG. 3, a wafer 110 is provided wherein a plurality of bumps 120 are disposed on the surface 111 of the wafer 110. The bumps 120 possess metal gloss for identification by optical detectors. The wafer 110 includes a plurality of dies 112 where the dies 112 are semiconductor active components including ICs which can be assembled in BGA (Ball Grid Array) packages, in TCP (Tape Carrier Packages) or in other known packages. The surface 111 of the wafer 110 has a plurality of scribe lines 113 where the scribe lines 113 in X-direction and the scribe lines 113 in Y-direction are perpendicular to each other to define the boundaries of the dies 112. Dicing blades or laser can be used to singulate the wafer 110 into individual dies 112 along the scribe lines 113. As shown in FIG. 3, in the present embodiment, the bumps 120 are disposed on the incomplete edge dies 114 of the wafer 110. The incomplete edge dies 114 are located at the peripheries of the wafer 110 surrounding the complete dies 112 and are scrapped. Normally, the incomplete edge dies 114 are different from the complete dies 112 in shape and in dimension and even in color. Accordingly, the bumps 120 do not occupy the complete die regions of the wafer 110 without affecting the structure of the complete dies 112. The bumps 120 can be scrapped separated from the complete dies 112 during the sawing process. In an alternative embodiment, the bumps 120' are disposed within the dies 112 as shown in FIG. 5. Preferably, there is at least one bump 120 is disposed on each die 112 to form alignment points in rows and in columns for wafer sawing process. As shown in FIG. 5 again, a bump 120' is disposed on each die 112 located at the center of the corresponding die 112 where the bump 120' is a dummy bump without any electrical function. Furthermore, the bumps 120 and 120' can be formed by plating, printing, or ball placement. As shown in FIG. 2A again, the bumps 120 are extruded from the surface 111. In the present embodiment, the bumps 120 can be metal columns such as copper pillars. In other embodiments, the bumps 120 can be spheres such as solder balls. The dimensions of the bumps 120 can be the same as the extruded electrodes (not shown in the figures) disposed on the dies 112 of the wafer 110.

Then, step 2 is performed to place a dielectric tape 130 on a mold plate 140 as shown in FIG. 2B, wherein the dielectric tape 130 become soft and fluid under heating or/and pressure to enable the insertion of the bumps such as the dielectric tape 130 has the B-stage characteristic, i.e., partially cured states. In different embodiments, the dielectric tape 130 can be a hot melt adhesive (HMA). The dielectric tape 130 enables to comply with the attached surface 111 of the wafer 110 to have proper adhesion with good coplanarity so that the dielectric tape 130 can be compliantly bonded to the wafer 110 in step 3 that follows as shown in FIG. 2C. On the other hand, preferably, the mold plate 140 has a plurality of holes 141 disposed corresponding to the bumps 120 of the wafer 110. In the present embodiment, the holes 141 penetrate through the mold plate 140 where the holes 141 can be formed by laser drilling or mechanical drilling. To be more specific, the dielectric tape 130 covers the holes 141. There may be no adhesion or minor adhesion between the dielectric tape 130 and the mold plate 140 for easy peeling release such as a thin stripping agent is pre-coated on the mold plate 140.

Then, step 3 is performed to laminate the wafer 110 and the mold plate 140 as shown in FIG. 2C. The surface 111 of the wafer 110 is attached to the dielectric tape 130 on the mold plate 140 to make the dielectric tape 130 be compliantly bonded to the surface 111 of the wafer 110 with the bumps 120 embedded in the dielectric tape 130. By the compliant nature of bonding, the surface 111 has no exposed area where no gap is remained between the wafer 110 and the dielectric tape 130. In the present embodiment, the surface 111 of the wafer 110 covered by the dielectric tape 130 is an active surface where the active surface is the wafer surface where ICs are fabricated. In different embodiment, the surface 111 of the wafer 110 covered by the dielectric tape 130 can be a back surface. Preferably, the dielectric tape 130 adhered to the surface 111 of the wafer 110 is configured as a die-attaching material (DAM) to completely cover the surface 111 so that the individual dies 112 after singulation can have the adhesion to directly attach to chip carriers to reduce the assembly processing time. As shown in FIG. 2C, the holes 141 of the mold plate 140 are located corresponding to the bumps 120 of the wafer 110 to avoid damages of the bumps 120 pressed against the mold plate 140. Even the dielectric tape 130 is bleeding due to the exerted pressure during the laminating step wherein the bleeding of the dielectric tape 130 can be accommodated in the indentation design of the holes 141 and formed between the wafer 110 and the mold plate 140 without contamination of the other surface of the wafer 110. Preferably, the holes 141 penetrate through the mold plate 140 so that the air generated during lamination can be exhausted through the holes 141. In step 3 mentioned above, the bumps 120 penetrate through the dielectric tape 130 to form a plurality of extruded tips 121 aligned in the holes 141 to effectively save the lapping thickness of the dielectric tape 130 in the following process which is described in detail later. To be more specific, the diameter of the holes 141 is slightly larger than the one of the extruded tips 121 to accommodate the extruded tips 121. Moreover, directly contact of the extruded tips 121 with the mold plate 140 can be avoided due to the design of the holes 141 so that the wafer 110 and the dielectric tape 130 can compliantly attach to each other. In the present embodiment, as shown in FIG. 2C, the bumps 120 during the laminating step 3 have a height H larger than the thickness T of the dielectric tape 130 but smaller than the total thickness of the thickness T of the dielectric tape 130 plus the depth D of the corresponding holes 141 to effectively avoid the non-attaching gaps formed between the wafer 110 and the dielectric tape 130.

After lamination, step 4 is performed to remove the mold plate 140 as shown from FIG. 2C to FIG. 2D to expose the dielectric tape 130 and the extruded tips 121 of the bumps 120 for the following lapping process.

Then, step 5 is performed to flatten the dielectric tape 130 with the extruded tips 121 leveled as shown in FIG. 2E. In the present embodiment, Chemical Mechanical Polishing (CMP) or the existing lapping technologies can be implemented to lap the dielectric tape 130 to make the dielectric tape 130 have a flattened surface 131 and to expose the exposed surfaces 122 of the bumps 120 wherein the exposed surfaces 122 of the bumps 120 and the flattened surface 131 of the dielectric tape 130 are coplanar to effectively provide the alignment points for the image recognition system of the sawing equipment. Preferably, the bumps 120 are homogeneous to keep the exposed surfaces 122 have the same metal gloss for whatever degree of the flattening may be.

As shown in FIG. 4, the dielectric tape 130 can fully cover the surface 111 of the wafer 110. After planarization, the exposed surfaces 122 of the bumps 120 can be exposed. Preferably, the exposed surfaces 122 of the bumps 120 can be the alignment points for wafer sawing process to enable singluation of individual dies 112 along the scribe lines 113 of the wafer 110 as shown in FIG. 3 and FIG. 4. In the present embodiment, the exposed surfaces 122 of the bumps 120 can form three corners of a triangle but not necessary an equilateral triangle to enhance the accurate alignment for the following wafer sawing process.

Therefore, the exposed surfaces 122 of the bumps 120 are formed by flattening the dielectric tape 130 after embedding the bumps 120 in the dielectric tape 130 during the lamination process and. The exposed surfaces 122 can be served as effective alignment points for wafer sawing process. The unattached interfaces between the wafer 110 and the dielectric tape 130 can be avoided during the steps of providing and laminating a dielectric tape 130, moreover, the lapping time of the flattening step can be greatly reduced. Due to the design of the holes 141 of the mold plate 140 corresponding to the bumps 120 to accommodate the extruded tips 121 of the bumps 120 during the lamination process so that the extruded tips 121 can't directly contact with the mold plate 140 where the bumps 120 can't be damaged and the wafer 110 with the bumps 120 are well protected. Therefore, the wafer 110 can compliantly bond to the dielectric tape 130 under a downward exerted force without limiting by the heights of the bumps 120.

According to the second embodiment of the present invention, another wafer level packaging method is described from FIGS. 6A to 6D for cross-sectional views of the components of a wafer during the wafer level packaging method. The primary steps of the wafer level packaging method is about the same as the ones of the first embodiment such as "providing a wafer", "placing a dielectric tape on a mold plate", "laminating the wafer and the mold plate", "removing the mold plate", and "flattening the dielectric tape" as shown in FIG. 1 and the described components such as wafer 110, dielectric tape 130, and the mold plate 140 are the same as the first embodiment, therefore, the component numbers follow the component definitions of the first embodiment to eliminate further detail description of the components.

Figure 6A:
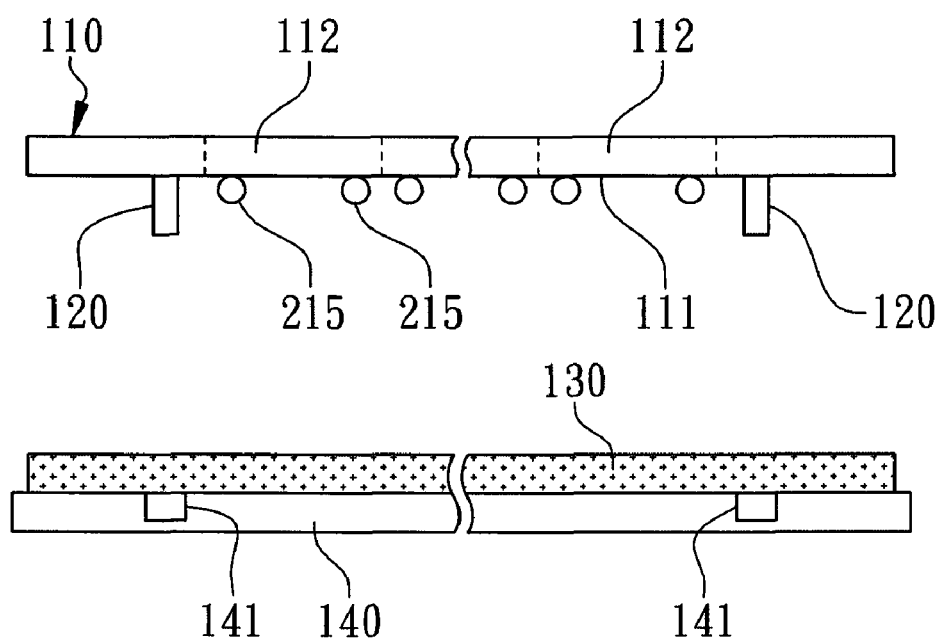
FIGS. 6A to 6D are cross-sectional views of a wafer during the wafer level packaging method according to the second embodiment of the present invention.

Firstly, step 1 and step 2 are performed. As shown in FIG. 6A, a plurality of bumps 120 are disposed on the surface 111 of the wafer 110. In the present embodiment, the wafer 110 includes a plurality of dies 112 where a plurality of extruded electrodes 215 are disposed on the dies 112. The bumps 120 and the extruded electrodes 215 are disposed on the same surface 111 of the wafer 110. In the present embodiment, the mold plate 140 has a plurality of holes 141 where the holes 141 are cavities without penetrating through the mold plate 140.

Figure 6B:
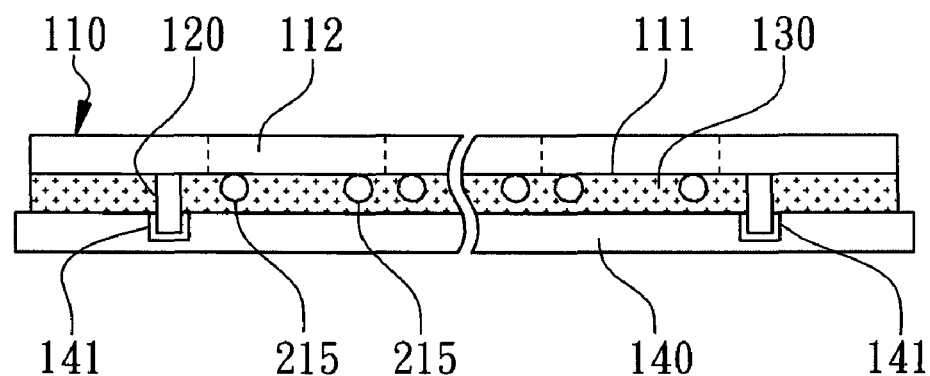
Figure 6C:
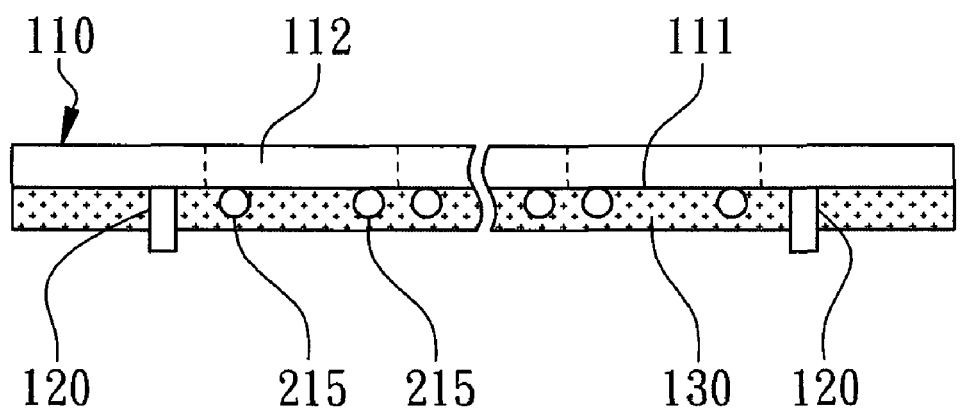

Then, step 3 is performed. As shown in FIG. 6B, the wafer 110 and the mold plate 140 are laminated to make the dielectric tape 130 on the mold plate 140 be compliantly bonded to the surface 111 of the wafer 110 and the bumps 120 be embedded in the dielectric tape 130. When parts of the bumps 120 are extruded from the dielectric tape 130, the extruded parts can be aligned in the holes 141. To be more specific, the extruded electrodes 215 are just barely covered by the dielectric tape 130 so that the extruded electrodes 215 can easily be exposed by the sequent flattening step 5. Before flattening, step 4 is performed to remove the mold plate 140 as shown in FIG. 6C.

Figure 6D:
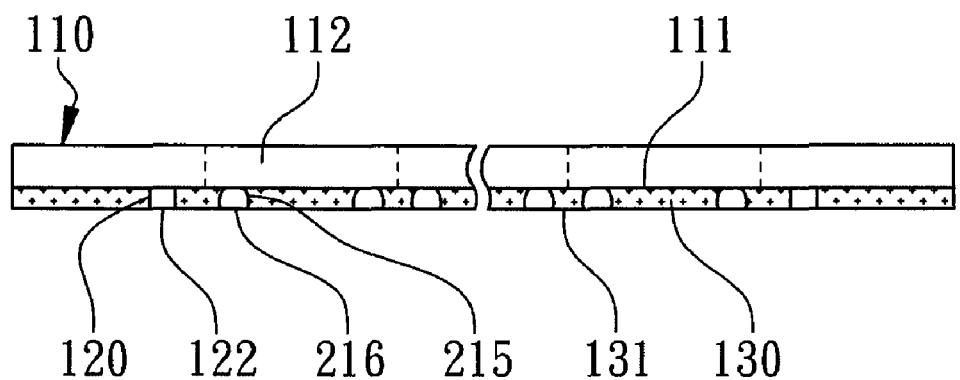

Finally, as shown in FIG. 6D, the dielectric tape 130 is flattened in step 5. In the meanwhile, a plurality of exposed surfaces 122 of the bumps 120 are formed wherein the exposed surfaces 122 of the bumps 120 and the flattened surface 131 of the dielectric tape 130 are coplanar. In the present embodiment, after planarization, the extruded electrodes 215 on the dies 112 also have a plurality of conductive surfaces 216 exposed from the flattened surface 131 of the dielectric tape 130. To be more specific, the extruded electrodes 215 can serve as input or output terminals for the internal circuits of the dies 112, moreover, the conductive surfaces 216 can electrically connect to the chip carriers by flip chip technology. In the present embodiment, the extruded electrodes 215 are solder balls formed by solder reflowing, but not limited. Alternatively, the extruded electrodes 215 can be metal pillars formed by electroplating or printing with reflowing. The bumps 120 can be metal pillars formed by plating. After planarization, the conductive surfaces 216, the exposed surfaces 122, and the flattened surface 131 are coplanar. In the present embodiment, the dielectric tape 130 can be an encapsulation resin for wafer level packaging. After removing the mold plate 140 and before flattening the dielectric tape 130, the wafer level packaging method further comprises a curing step to cure the dielectric tape 130 to make the dielectric tape 130 encapsulate the surface 111 of the wafer 110.

To summarize the above description, the wafer level packaging method according to the present invention can provide effective alignment points on the covered wafer 110 during wafer sawing process to make the bumps 120 and the extruded electrodes 215 on the wafer 110 have the same heights.

The above description of embodiments of this invention is intended to be illustrative but not limited. Other embodiments of this invention will be obvious to those skilled in the art in view of the above disclosure which still will be covered by and within the scope of the present invention even with any minor modifications, equivalent variations, and adaptations.

What is claimed is:

1. A wafer level packaging method comprising:
   providing a wafer including a plurality of bumps disposed on a surface of the wafer;
   placing a dielectric tape on a mold plate;
   laminating the wafer and the mold plate to make the dielectric tape be compliantly bonded to the surface of the wafer and the bumps be embedded in the dielectric tape;
   removing the mold plate; and
   flattening the dielectric tape to form a plurality of exposed surfaces of the bumps wherein the exposed surfaces of the bumps and the flattened surface of the dielectric tape are coplanar;
   wherein the mold plate has a plurality of holes to accommodate the individual bumps;
   wherein the bumps with a plurality of extruded tips penetrate through the dielectric tape and the extruded tips are accommodated in the holes during the laminating step; and
   wherein the bumps during the laminating step have a height greater than the thickness of the dielectric tape but smaller than the total thickness of the thickness of the dielectric tape plus the depth of the corresponding holes.

2. The method as claimed in claim 1, wherein the holes penetrate through the mold plate.

3. The method as claimed in claim 1, wherein the surface of the wafer covered by the dielectric tape is an active surface.

4. The method as claimed in claim 1, wherein the dielectric tape is in B-stage during the laminating step.

5. The method as claimed in claim 1, wherein the surface of the wafer covered by the dielectric tape is a back surface.

6. The method as claimed in claim 1, wherein the dielectric tape is an encapsulation resin.

7. The method as claimed in claim 1, wherein the bumps are homogeneous.

8. The method as claimed in claim 3, wherein the exposed surfaces of the bumps include a plurality of alignment marks for a wafer sawing process.

9. The method as claimed in claim 8, wherein the wafer comprises a plurality of dies and a plurality of incomplete edge dies where the bumps are disposed on the incomplete edge dies.

10. The method as claimed in claim 8, wherein the wafer comprises a plurality of dies where the bumps are located within the dies.

11. The method as claimed in claim 9, wherein the wafer further comprises a plurality of extruded electrodes disposed on the dies, each extruded electrode having a conductive surface exposed from the dielectric tape after the flattening step.

12. The method as claimed in claim 10, wherein at least one bump is disposed on each die to form alignment points in rows and in columns for wafer sawing.

13. The method as claimed in claim 5, wherein the dielectric tape is a Die Attaching Material (DAM) to completely cover the surface.

14. The method as claimed in claim 6, further comprising a curing step to cure the dielectric tape after removing the mold plate and before flattening the dielectric tape.

15. A wafer level packaging method comprising:
   providing a wafer including a plurality of bumps disposed on a surface of the wafer;
   placing a dielectric tape on a mold plate;
   laminating the wafer and the mold plate to make the dielectric tape be compliantly bonded to the surface of the wafer and the bumps be embedded in the dielectric tape;
   removing the mold plate; and
   flattening the dielectric tape to form a plurality of exposed surfaces of the bumps wherein the exposed surfaces of the bumps and the flattened surface of the dielectric tape are coplanar;
   wherein the mold plate has a plurality of holes to accommodate the individual bumps;
   wherein the bumps with a plurality of extruded tips penetrate through the dielectric tape and the extruded tips are accommodated in the holes during the laminating step; and
   wherein the extruded tips are leveled during the flattening step.

16. A wafer level packaging method comprising:
   providing a wafer including a plurality of bumps disposed on a surface of the wafer;
   placing a dielectric tape on a mold plate;
   laminating the wafer and the mold plate to make the dielectric tape be compliantly bonded to the surface of the wafer and the bumps be embedded in the dielectric tape;
   removing the mold plate; and
   flattening the dielectric tape to form a plurality of exposed surfaces of the bumps wherein the exposed surfaces of the bumps and the flattened surface of the dielectric tape are coplanar;
   wherein the surface of the wafer covered by the dielectric tape is an active surface;
   wherein the exposed surfaces of the bumps include a plurality of alignment marks for a wafer sawing process;
   wherein the wafer comprises a plurality of dies where the bumps are located within the dies;
   wherein at least one bump is disposed on each die to form alignment points in rows and in columns for wafer sawing; and
   wherein the bump on each die is located at the center of the corresponding die where the bump is a dummy bump without any electrical function.

* * * * *